United States Patent [19]

Fukaya

[11] Patent Number: 4,825,282

[45] Date of Patent: Apr. 25, 1989

[54] SEMICONDUCTOR PACKAGE HAVING SIDE WALLS, EARTH-BONDING TERMINAL, AND EARTH LEAD FORMED IN A UNITARY STRUCTURE

[75] Inventor: Jun Fukaya, Shinjuku, Japan

[73] Assignee: Fujitsu Limited, Kanagawa, Japan

[21] Appl. No.: 147,633

[22] Filed: Jan. 25, 1988

Related U.S. Application Data

[63] Continuation of Ser. No. 42,626, Apr. 23, 1987, abandoned, which is a continuation of Ser. No. 822,514, Jan. 27, 1986, abandoned.

[30] Foreign Application Priority Data

Jan. 30, 1985 [JP] Japan ................................. 60-015904
Sep. 19, 1985 [JP] Japan ................................. 60-207503
Sep. 19, 1985 [JP] Japan ........................... 60-142994[U]

[51] Int. Cl.⁴ ..................... H01L 23/48; H01L 23/02; H01L 39/02
[52] U.S. Cl. ........................................ 347/74; 357/68; 357/69; 357/70; 357/72; 357/80; 357/81
[58] Field of Search .................... 357/68, 28, 41, 70, 357/74, 69, 72, 80, 81

[56] References Cited

U.S. PATENT DOCUMENTS

| | | | |
|---|---|---|---|
| 3,502,786 | 3/1970 | Stoll | 174/52 |
| 3,801,938 | 4/1974 | Goshgarian | 333/84 M |
| 3,864,727 | 2/1975 | Schoberl | 357/65 |
| 3,893,193 | 7/1975 | Anazawa et al. | 333/84 |
| 3,946,428 | 3/1976 | Anazawa et al. | 357/74 |
| 4,030,001 | 6/1977 | Medley, Jr. et al. | 361/401 |
| 4,297,722 | 10/1981 | Nagahama et al. | 357/74 |

FOREIGN PATENT DOCUMENTS

| | | |
|---|---|---|
| 0018174 | 10/1980 | European Pat. Off. . |
| 0110997 | 6/1984 | European Pat. Off. . |
| 52-40974 | 3/1977 | Japan ................................. 357/74 |
| 55-44755 | 3/1980 | Japan ................................. 357/74 |
| 58-52858 | 3/1983 | Japan ................................. 357/74 |
| 59-99745 | 6/1984 | Japan ................................. 357/74 |
| WO8001966 | 9/1980 | World Int. Prop. O. ............ 357/68 |

OTHER PUBLICATIONS

IBM Technical Disclosure Bulletin, vol. 18, No. 7, Dec. 1975, DeBar et al, "Module Spark Gap".

Primary Examiner—Andrew J. James
Assistant Examiner—Ngan V. Ngo
Attorney, Agent, or Firm—Armstrong, Nikaido, Marmelstein, Kubovcik & Murray

[57] ABSTRACT

A semiconductor device comprising: a base plate for mounting a semiconductor chip; side walls disposed on the base plate to surround the semiconductor chip; an input lead piece and an output lead piece, both being connected to the semiconductor chip and extending outward from the side walls; and at least one earth lead piece extending outward from the side wall between the positions from where the input and output lead pieces are taken out. The side walls at the positions from where the input and output lead pieces are taken out are made of electrical insulation material. The side wall at the position from where the earth lead piece is taken out is made of metal as one body integral with a bonding terminal extending inward of the side wall and the earth lead piece extending outward of the side wall.

5 Claims, 8 Drawing Sheets

SEMICONDUCTOR PACKAGE HAVING SIDE WALLS, EARTH-BONDING TERMINAL, AND EARTH LEAD FORMED IN A UNITARY STRUCTURE

This application is a continuation of application Ser. No. 42,626 filed Apr. 23, 1987, which is a continuation of application Ser. No. 822,514 filed Jan. 27, 1986, both abandoned.

BACKGROUND OF THE INVENTION

1. Field of the Invention

The present invention relates to a semiconductor device. More particularly, it relates to a package structure for housing a ultra-high frequency semiconductor chip.

The package of the ultra-high frequency semiconductor device comprising, for example, a gallium arsenic field effect transistor (FET) used in a giga hetz frequency band should be constructed so that the function of the highly improved semiconductor chip is not degraded and that the package is easily made.

2. Description of the Related Art

A semiconductor device utilizing an FET chip comprises a package for housing the chip, an input lead piece, an output lead piece, and two earth lead pieces for grounding and power supply.

The conventional semiconductor device known to the inventor comprises a semiconductor chip mounted on a ceramic base plate, four ceramic side walls rectangularly arranged surrounding the semiconductor chip, a cap secured to the upper edges of the side walls via a metallized film, an input lead piece and an output lead piece extending from each of the pair of opposing side walls, and two earth lead pieces extending from the other pair of opposing side walls. The earth lead pieces are connected to the semiconductor chip through a metallized film coated on the base plate and side walls.

In the above conventional semiconductor device structure, a satisfactory grounding function has not been obtained since the metallized film is very thin. Also, the characteristic of the device is unstable since unnecessary noise signals are transmitted from the input lead piece to the output lead piece or vice versa through the metallized film coated on the upper edges of the side walls.

SUMMARY OF THE INVENTION

The present invention aims to obviate the above mentioned drawbacks of the conventional semiconductor device by providing a semiconductor device which achieves a satisfactory grounding function by reducing the inductance of the grounding line, and which has a stable characteristic inhibiting unnecessary transmittance of signals from the input terminal to the output terminal or vice versa, bypassing the semiconductor chip.

A semiconductor device in accordance with the present invention comprises:

a base plate for mounting a semiconductor chip;

side walls disposed on the base plate to surround the semiconductor chip;

an input lead piece and an output lead piece, both being connected to the semiconductor chip and extending outward from the side walls; and at least one earth lead piece extending outward from the side wall between the positions from where the input and output lead pieces are taken out, characterized in that the side walls at the positions from where the input and output lead pieces are taken out are made of electric insulation material and that the side wall at the position from where the earth lead piece is taken out is made of metal integral with a bonding terminal extending inward of the side wall and the outer earth lead piece as one body.

DESCRIPTION OF THE PREFERRED EMBODIMENTS

Embodiments of the present invention will now be described with reference to the drawings and in comparison with the related art known to the inventor.

Figure 7A:
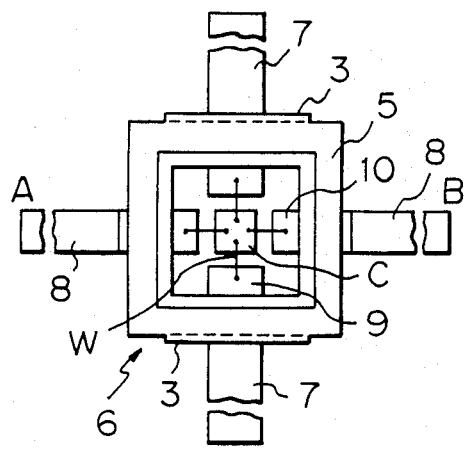
FIGS. 7a–c how a related conventional semiconductor device in a way similar to FIG. 1.
Figure 7B:
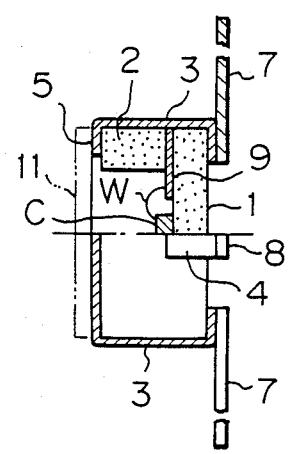
Figure 7C:
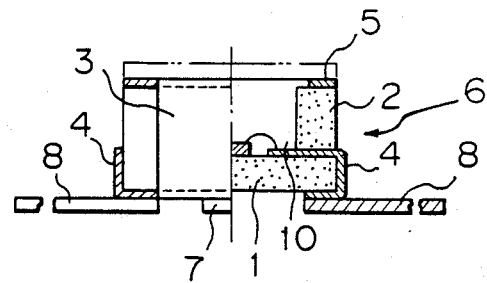

A conventional package structure utilized for an ultra-high frequency semiconductor device is illustrated in FIG. 7, wherein (a) is a plan view and (b) and (c) are partial sectional views.

In the drawing, numeral 1 designates a rectangular ceramic base plate A side wall 2 having a continuous rectangular frame shape in the plan view is disposed on the base plate 1 along the four edges thereof. Metallized films 3 are coated on the opposing outer surfaces of the side wall 2 and the base plate 1. The metallized films 3 are made of, for sample, tungsten. Further metallized films 4 for leading input and output signals are coated on the further opposing outer surfaces of the base plate 1. The upper edge surface of the side wall 2 is coated with a metallized film 5 in a rectangular frame shape in plan view, for sealing a cap 11. The metallized film 5 is connected to the metallized films 3. The metallized films 4 and 5 are made of the same material as the metallized film 3. The base plate 1, the side wall 2, and the metallized film 3 to 5 simultaneously undergo sintering process to form a container box shaped base unit 6.

Outer lead pieces 7 and input and output pieces 8 of metal such as Kovar (Westinghouse Electric Corp.) are brazed to the bottom edges of the base plate 1 through the metallized films 3 and 4 to form a package for the semiconductor device. The lead pieces 7 and 8 are plated with gold.

A semiconductor chip C is bonded on the base plate 1 at the center thereof and connected through wires W to metallized films 9 and 10 disposed on the base plate 1 projecting inside of the side wall 2 and connected to the metallized films 3 and 4, respectively, to serve as inner bonding terminals. After that, the cap 11 of, for example, Kovar is brazed on the upper edge surface of the side wall 2 via the metallized film 5 to seal the package.

In the above mentioned structure, the semiconductor chip C is connected to the outer earth lead pieces 7 through the metallized films 3 and 9, which are very thin. Conventionally, the metallized film 3 has a thickness of several $\mu$m. Therefore, in a high frequency band, the grounding function of the earth lead pieces 7 through the metallized films 3 and 9 is degraded due to the inductance of the metallized films 3 and 9. Accordingly, problems have occurred with the conventional semiconductor device in that a desired gain is not obtained when the frequency is made higher and that a stable function is not achieved due to the feedback signals from the output terminal to the input terminal through the metallized film 5 and the cap 11.

Figure 8:
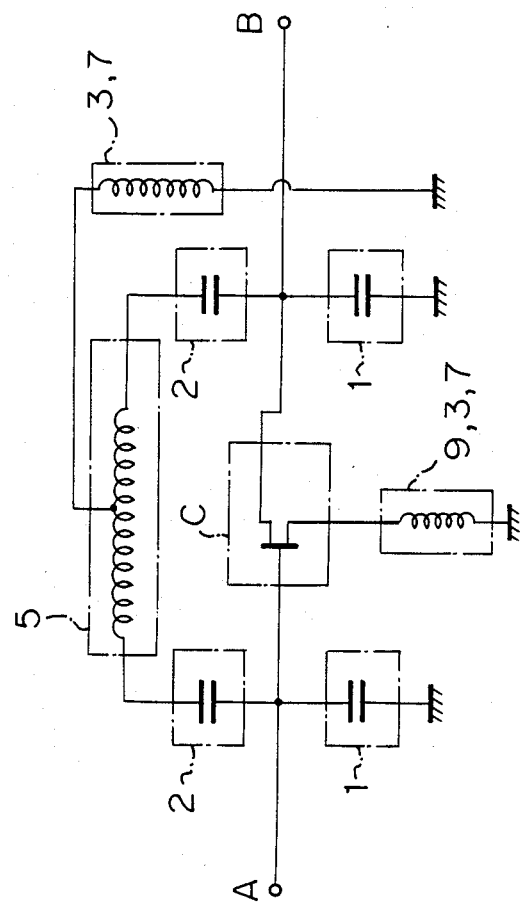
FIG. 8 is an equivalent circuit diagram of the semiconductor device of FIG. 7.

This is further described with reference to FIG. 8, which is an equivalent circuit diagram of the semiconductor device of FIG. 7.

Input terminal A and output terminal B are connected to the semiconductor chip C such as an FET. The side wall 2 serves as a condenser and the metallized film 5 coated on the side wall 2 serves as an inductance coil, so that a circuit is formed bypassing the semiconductor chip C from the input terminal A to the output terminal B to transmit unnecessary noise signals, which degrade the characteristic of the transistor. The earth lead piece 7 is connected to the middle portion of the metallized film 5 through the metallized film 3 coated on the outer face of the side wall 2. The metallized film 3 is very thin, as mentioned before, and the inductance thereof is very large, so that it cannot completely lead the unnecessary signals to the ground to prevent the transmittance of the signals from the input terminal A to the output terminal B or vice versa.

The terminal for grounding of the semiconductor chip C is connected to the ground through the metallized films 3 and 9 and the earth lead piece 7, in which the metallized films 3 and 9 are very thin, as mentioned before, and the inductance thereof is very large, which adversely influences the grounding function.

Figure 1A:
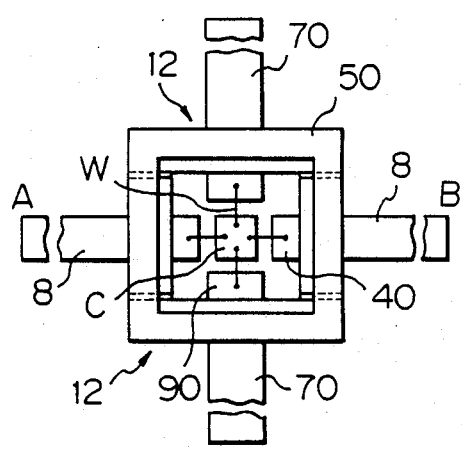
FIG. 1 shows a semiconductor device according to the present invention, wherein (a) is a plan view and (b) and (c) are partial sectional views thereof.
Figure 1B:
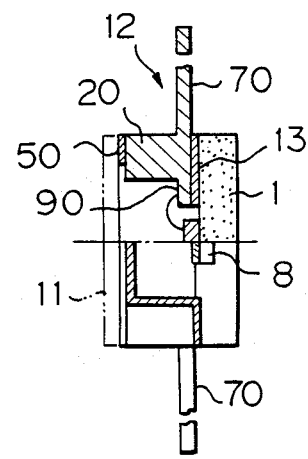
Figure 1C:
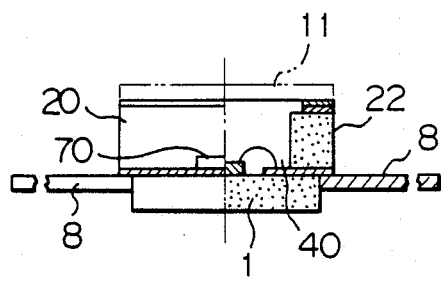
Figure 2:
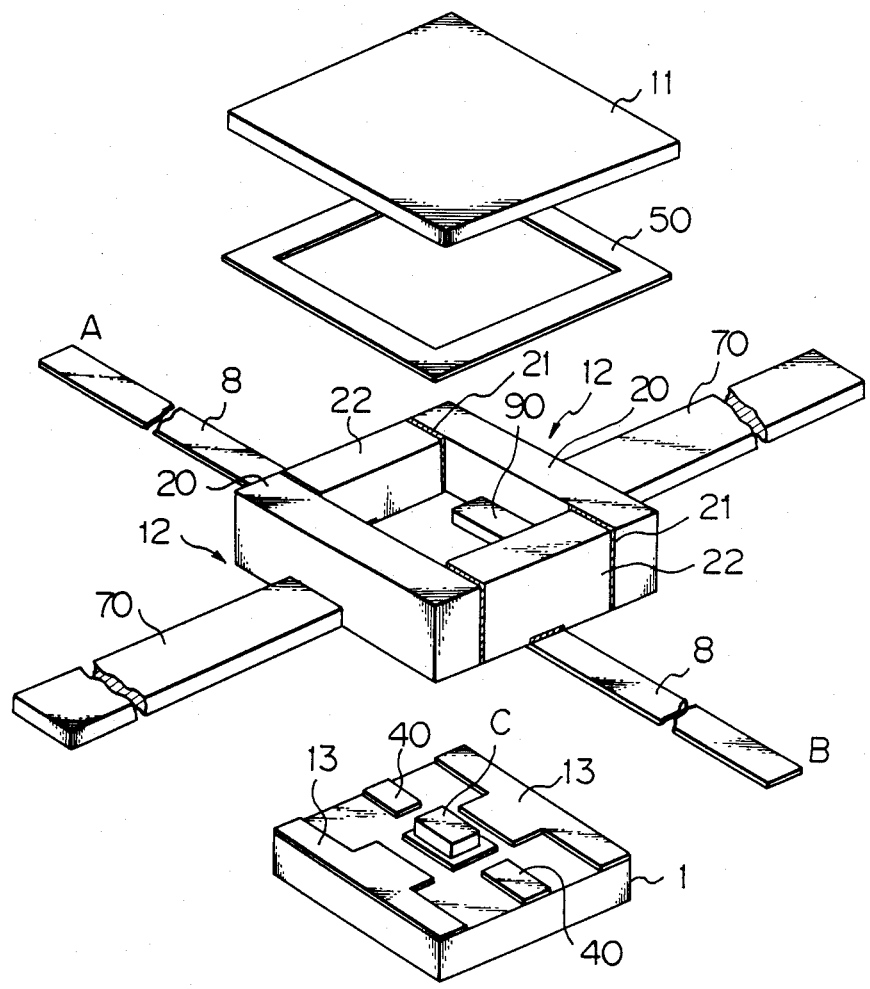
FIG. 2 is a perspective view of the semiconductor device of FIG. 1.

Such drawbacks are obviated in a semiconductor device according to the present invention and illustrated in FIGS. 1 and 2. A primary difference of the package structure of FIG. 1 over that of FIG. 7 resides in that the side wall on the side from which the outer lead piece 70 for grounding extends is formed by metal as a metal wall 20, which is integral with an outer earth lead piece and an inner bonding terminal.

In FIGS. 1 and 2, numeral 1 designates a rectangular base plate made of electric insulation material such as ceramic. Metal walls 20 are disposed on the opposing sides of the rectangular base plate 1. The metal walls 20 are made of e.g. oxygen-free copper. Ceramic side walls 22 are disposed on the other opposing sides of the rectangular base plate 1. From the ceramic side walls 22, input and output outer lead pieces 8 extend outward. The metal wall 20 is formed integral with an outer earth lead piece 70 and an inner bonding terminal 90 as one body to form an earth terminal block 12. Input and output metallized films 40 are formed on the base plate 1 to connect the semiconductor chip C to the input and output lead pieces 8 through wires W. A rectangular ring seal 50 of metal such as Kovar is disposed on the upper edges of the metal. walls 20 and the ceramic walls 22 for sealing a cap 11. The seal 50 corresponds to the metallized film 5 of FIG. 7. The metallic earth terminal block 12 is bonded to the base plate 1 through a metallized film 13. The metal wall 20 and the ceramic wall 22 are bonded together through a metallized film 21.

The base plate 1, the ceramic walls 22 and metallized films 40, 21, 13 undergo a sintering process together to form a base unit. The earth terminal blocks 12 are brazed at a predetermined position on the unit. Also, the metal seal ring 50 and input and output outer lead pieces 8 are brazed at a predetermined position on the base unit to form a package. Each outer lead piece is plated with gold.

A semiconductor chip C is mounted on the base plate 1 in a same manner as depicted in FIG. 7 except that the inner bonding terminal 9 of FIG. 7 is replaced by a thickened inner bonding terminal 90. After the semiconductor chip C is housed within the package, the cap 11 is brazed onto the rectangular metal ring 50 to seal the package.

In this package structure, the outer earth lead piece 70, the inner bonding terminal 90, and the metal ring 50 for sealing the cap are interconnected through the thick metal side wall 20 having very little inductance compared with the structure of FIG. 7, which makes it possible to achieve a satisfactory grounding function at a high frequency. For example, if the maximum usable frequency in the structure of FIG. 7 is about 12 GHz, it is possible to increase the maximum frequency to about 20 GHz by adopting the structure of FIGS. 1 and 2.

Figure 3:
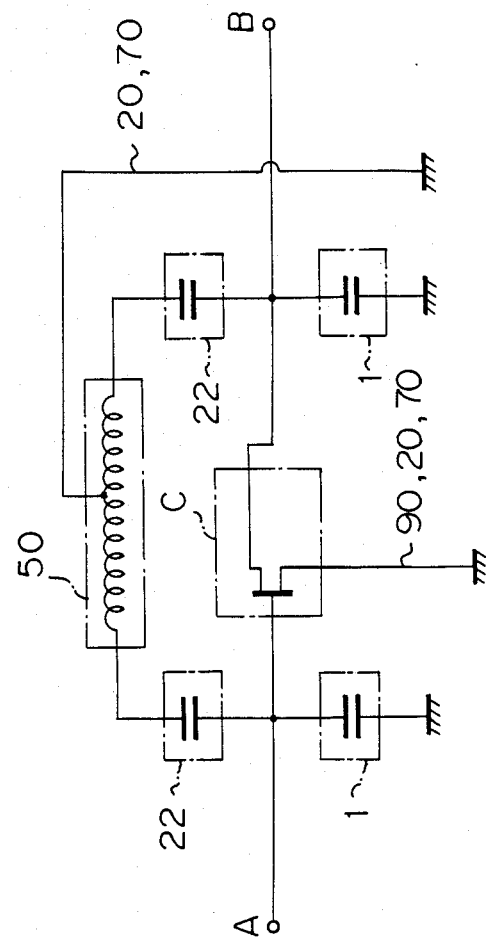
FIG. 3 is an equivalent circuit diagram of the semiconductor device of FIG. 1.

An equivalent circuit diagram of the semiconductor device of FIGS. 1 and 2 is illustrated in FIG. 3. As can be seen from the diagram, in comparison with the diagram of FIG. 8, the unnecessary signals transmitted from the input terminal A to the output terminal B or vice versa through the metal ring 50 which constitutes a bypass circuit are almost completely lead to the ground in the middle of the metal ring 50 since the metal ring 50 is connected to the ground through a thick metal side wall 20 which has almost no inductance, thus inhibiting the transmittance of signals between the terminals A and B through the bypass circuit, which stabilizes the characteristic of the semiconductor device. Also, the earth terminal of the transistor chip C is lead to the ground through the thick inner bonding terminal 90, the metal side wall 20, and outer lead piece 70 which are made integrally as one metal block having almost no inductance, thus achieving a satisfactory and reliable grounding function.

With the structure of FIGS. 1 and 2, when assembling the semiconductor device, a pair of earth terminal blocks 12 composed of the inner terminal 90, the side wall 20, and the outer lead piece 70 is disposed on the base plate 1, the two blocks 12 being aligned with each other at a predetermined position. The actual dimension of the semiconductor device is usually very small, for instance, the package container box is 1.8 mm square, the length of each lead piece is about 3 mm, the height of the package is about 0.7 mm. The assembling operation of such minute parts in alignment with each other is not easy.

Figure 4A:
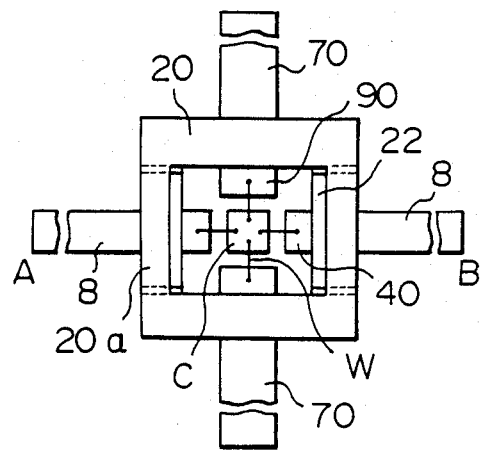
FIGS. 4a–c show another embodiment of the semiconductor device according to the present invention in a way similar to FIG. 1.
Figure 4B:
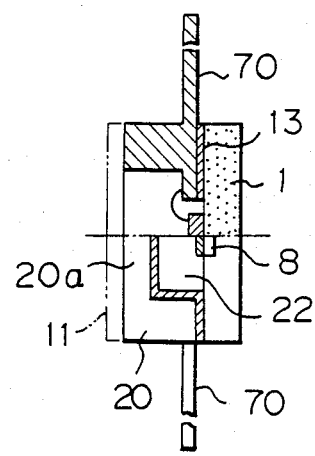
Figure 4C:
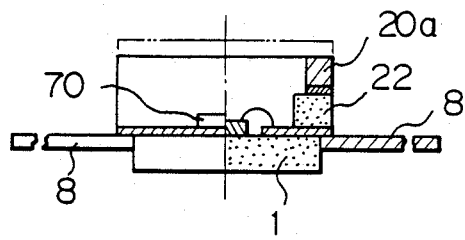
Figure 5:
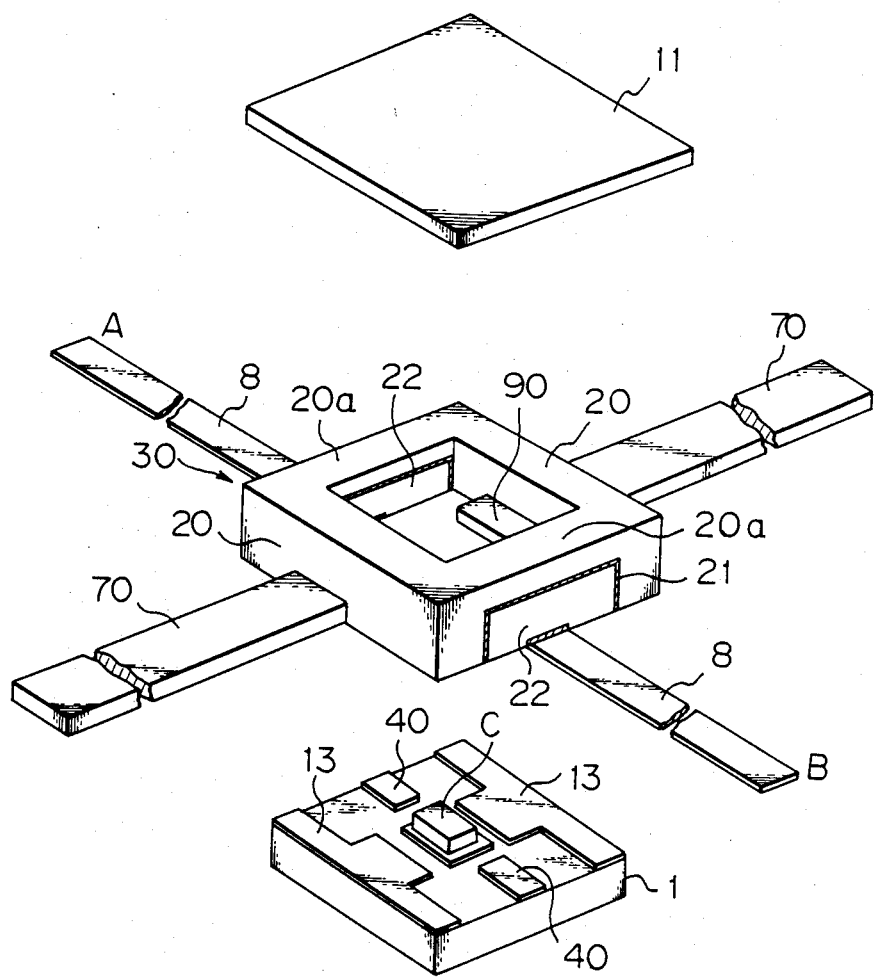
FIG. 5 is a perspective view of the semiconductor device of FIG. 4.

FIGS. 4 and 5 show another embodiment of the present invention wherein a further improvement resides in that the package is easily assembled. In this embodiment, the two opposing metal side walls 20 are interconnected through the same metal connecting bridges 20a above the ceramic side walls 22 to form an earth terminal block 30 as one metal body.

The ceramic side wall 22 from which the input or output lead piece 8 extends must have a sufficient height for reliable insulation, to stabilize the characteristic of the semiconductor device. The inventors have found that, in the structure of FIG. 1, a desirable maximum usable frequency can be maintained even if the height of the ceramic side wall 22 is shortened by about a half. This is because of the reduction of inductance in the circuit connected to the ground due to the metal side wall 20. Accordingly, it becomes possible to thicken the connecting bridge 20a which corresponds to the metal ring 50 of FIG. 1 without increasing the height of the package, thus realizing the earth terminal block 30 as one body having a compact size.

The other construction, function and effect of this embodiment are substantially the same as those of the embodiment of FIGS. 1 and 2, as described below.

This embodiment is further described hereinafter with reference to FIGS. 4 and 5. In the drawings, a bottom plate 1, a ceramic insulation wall 22, input and output metallized films 40, and metallized films 13 for bonding are sintered together to form a base unit of the package, similar to the structure of FIG. 1. The height of the insulation wall 22 is about $\frac{2}{3}$ that of FIG. 1.

An earth block 30 is made of a metal such as oxygen-free copper to form one body composed of two metal walls 20, each of which is integral with an inner bonding terminal 90 and an outer earth lead piece 70 as the metal wall of FIG. 1, the metal walls 20 being interconnected together by connecting bridges 20a at shoulder portions thereof. The height of each metal wall 20 is about the same as that of the assembled structure of the metal wall and the metal ring 50 of FIG. 1. The upper surfaces of the connecting bridge 20a and the metal wall 20 are in a same plane. The height of the connecting bridge 20a is substantially equal to the height difference between the metal wall 20 and the ceramic insulation wall 22. The earth terminal block 30 and outer input and output lead piece 8 are brazed at predetermined positions on the base unit to form a package. Outer lead pieces 8 and 70 are plated with gold. The package can be easily assembled since the two metal walls 20 are preassembled as one block 30 in alignment with each other and with an inner terminal 90 and outer piece 70.

A semiconductor chip C is mounted on the base plate 1 in a similar manner to that of FIG. 1. A cap 11 is brazed onto the earth terminal block 30 to seal the package.

The embodiment possesses all of the advantageous features of the embodiment of FIG. 1, and is further featured by the structure which can be easily assembled and used at a desirable high frequency without increasing the size thereof.

Figure 6A:
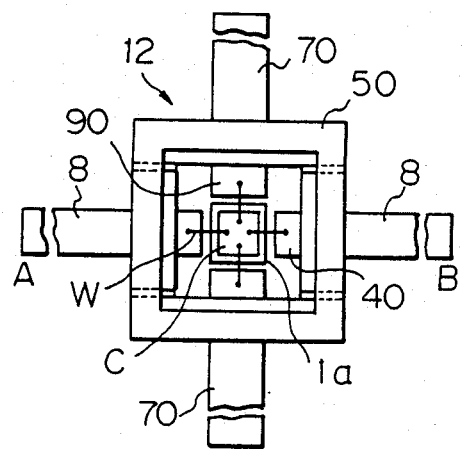
FIGS. 6a–c show still another embodiment of the semiconductor device according to the present invention in a way similar to FIG. 1.
Figure 6B:
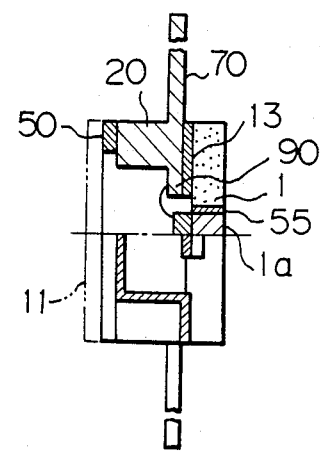
Figure 6C:
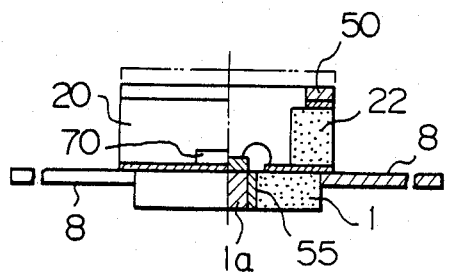

Still another embodiment of the present invention is illustrated in FIG. 6. In this embodiment, heat generated from the semiconductor chip C is effectively radiated. A mount 1a for mounting the semiconductor chip C is made of metal and disposed in the center of ceramic base plate 1. The mount 1a is bonded to the base plate 1 through a metallized film 55. The other construction, function and effect of this embodiment is substantially the same as those of the embodiment of FIG. 1.

With such a package structure, heat radiation from the semiconductor chip C is greatly enhanced since the semiconductor chip is mounted on the metal base mount 1a, thus the semiconductor chip C is effectively cooled, which prolongs the life thereof and enhances the reliability of the semiconductor device.

According to an experiment by the inventor, the temperature of the FET chip in this structure is about 100° C. lower than in the structure wherein the chip is mounted on the ceramic base plate instead of the metal mount.

Note that the metal mount 1a may be enlarged to overlap the inner bonding terminal 90 if it is allowed to come into electrically contact with the earth terminal block 12, instead of being isolated in the center of the base plate 1 as illustrated in FIG. 6. If the mount 1a is enlarged, the heat radiation is further enhanced.

I claim:

1. A semiconductor device comprising:
   a ceramic base plate for supporting a semiconductor chip mounted thereon;
   side walls disposed on said ceramic base plate to surround said semiconductor chip;
   an input lead piece and an output lead piece, both being connected to said semiconductor chip and extending outward from said side walls;
   at least one earth lead piece extending outward from said side wall between the positions from where said input and output lead pieces are taken out,
   wherein said side walls at said positions from where said input and output lead pieces are taken out are made of electrical insulation material and wherein said side wall at the position from where said earth lead piece is taken out is made of metal as one body integral with a bonding terminal extending inward of said side wall and said earth lead piece extending outward of said side wall;
   a sealing metal portion disposed on said metal side walls and on said electrically insulating side walls; and
   a cap disposed on said sealing metal portion to sealingly cover the semiconductor chip surrounded by said side walls.

2. A semiconductor device according to claim 1, wherein said side walls constitute four side faces of a rectangular box, said input and output lead pieces extending from a first pair of two opposing side faces of said box and wherein two earth lead pieces are provided such that said earth lead pieces extend from a second pair of two opposing side faces of said box.

3. A semiconductor device according to claim 2, wherein said second pair of opposing side faces are interconnected together above said first pair of opposing side faces through connecting bridges to form a metal earth terminal block as one body comprising two side walls each being integral with an inner bonding terminal and an outer earth piece.

4. A semiconductor device according to claim 1, 2, or 3, wherein at least a part of said base plate is made of metal for heat radiation, said semiconductor chip being mounted on said metal part.

5. A semiconductor device according to claim 1, wherein said semiconductor chip is an ultra-high frequency gallium arsenic field effect transistor.

* * * * *